United States Patent
Schroeck et al.

(10) Patent No.: US 10,738,392 B2
(45) Date of Patent: Aug. 11, 2020

(54) METHOD FOR DETERMINING AND REGULATING A DIAMETER OF A SINGLE CRYSTAL DURING PULLING OF THE SINGLE CRYSTAL

(71) Applicant: SILTRONIC AG, Munich (DE)

(72) Inventors: Thomas Schroeck, Kastl (DE); Thomas Aubrunner, Tacherting (DE)

(73) Assignee: SILTRONIC AG, Munich (DE)

( * ) Notice: Subject to any disclaimer, the term of this patent is extended or adjusted under 35 U.S.C. 154(b) by 82 days.

(21) Appl. No.: 15/781,850

(22) PCT Filed: Jan. 24, 2017

(86) PCT No.: PCT/EP2017/051446
§ 371 (c)(1),
(2) Date: Jun. 6, 2018

(87) PCT Pub. No.: WO2017/133930
PCT Pub. Date: Aug. 10, 2017

(65) Prior Publication Data
US 2018/0363163 A1    Dec. 20, 2018

(30) Foreign Application Priority Data

Feb. 5, 2016 (DE) .................. 10 2016 201 778

(51) Int. Cl.
*C30B 15/10*    (2006.01)
*C30B 15/22*    (2006.01)
(Continued)

(52) U.S. Cl.
CPC .............. *C30B 15/22* (2013.01); *C30B 15/20* (2013.01); *C30B 15/30* (2013.01); *C30B 29/06* (2013.01)

(58) Field of Classification Search
CPC .......... C30B 15/02; C30B 15/04; C30B 15/10
See application file for complete search history.

(56) References Cited

U.S. PATENT DOCUMENTS 4,660,149 A    4/1987    Lissalde et al.
5,170,061 A *   12/1992    Baba .................. C30B 15/20
                                                     117/14
(Continued)

FOREIGN PATENT DOCUMENTS

DE    42 31 162 A1    3/1994
EP    0 498 653 A2    8/1992
(Continued)

*Primary Examiner* — Robert M Kunemund
(74) *Attorney, Agent, or Firm* — Brooks Kushman P.C.

(57) ABSTRACT

The diameter ($d_K$) of a cylindrical section and of an end cone of a single crystal being pulled from a melt in a crucible, is determined by measuring the diameter ($d_K$) of the single crystal at an interface with the melt while taking into account a lowering rate ($v_s$) of a surface of the melt relative to the crucible, a lifting rate ($v_K$) with which the crystal is raised relative to the crucible, and a conservation of mass, wherein a diameter of a cylindrical section of the single crystal, determined by means of observing a bright ring on the surface of the melt, and is used for a correction, a plausibility check or a comparison of the diameter ($d_K$) of the single crystal.

12 Claims, 3 Drawing Sheets

(51) Int. Cl.
  *C30B 15/30* (2006.01)
  *C30B 29/06* (2006.01)
  *C30B 15/20* (2006.01)

(56) References Cited

U.S. PATENT DOCUMENTS

| | | | |
|---|---|---|---|
| 5,437,242 | A | 8/1995 | Hofstetter et al. |
| 5,653,799 | A * | 8/1997 | Fuerhoff ................. C30B 15/26 117/14 |
| 5,665,159 | A * | 9/1997 | Fuerhoff ................. C30B 15/26 117/14 |
| 5,746,825 | A | 5/1998 | Von Ammon et al. |
| 5,961,716 | A * | 10/1999 | White .................... C30B 15/26 117/14 |
| 6,106,612 | A | 8/2000 | White |
| 2010/0263585 | A1 | 10/2010 | Hamada |

FOREIGN PATENT DOCUMENTS

| | | |
|---|---|---|
| EP | 0 758 690 A1 | 2/1997 |
| JP | 63021280 A | 1/1988 |
| JP | 09221378 A | 2/1996 |
| JP | 2008184362 A | 8/2008 |
| JP | 2010248063 A | 11/2010 |
| WO | 83/02464 A1 | 7/1983 |

* cited by examiner

METHOD FOR DETERMINING AND REGULATING A DIAMETER OF A SINGLE CRYSTAL DURING PULLING OF THE SINGLE CRYSTAL

CROSS REFERENCE TO RELATED APPLICATIONS

This application is the U.S. National Phase of PCT Appln. No. PCT/EP2017/051446 filed Jan. 24, 2017, which claims priority to German Application No. 10 2016 201 778.0 filed Feb. 5, 2016, the disclosures of which are incorporated in their entirety by reference herein.

BACKGROUND OF THE INVENTION

1. Field of the Invention

The present invention relates to a method for determining a diameter of a single crystal during the pulling of the single crystal from a melt in a crucible. The diameter found may then be used as a variable to be regulated during the pulling of the single crystal.

2. Description of the Related Art

During the pulling of single crystals of semiconductor material by the so-called Czochralski method, it must be possible for the diameter of the single crystal to be monitored, i.e. determined, and influenced as appropriate. The variation in the diameter of the single crystal, this variation being dependent on the radial growth of the single crystal at the crystallization boundary, may for example be influenced by varying in a controlled way the lifting rate of the single crystal and/or the temperature of the melt in the region of the crystallization boundary.

In general, the diameter of the single crystal may be determined by means of optical acquisition means, for example a camera, by recording for example three points on a bright ring enclosing the single crystal in the region of the crystallization boundary, and calculating the diameter therefrom. This bright ring is a reflection of the glowing wall of the crucible, in which the melt is contained, on the liquid melt, which forms a so-called meniscus in the region of the crystallization boundary.

Toward the end of the pulling process, a so-called end cone on the single crystal is generally pulled, i.e. after a long cylindrical part, where the single crystal tapers conically to a small diameter. This avoids slips or dislocations in the single crystal, which occur during the separation of the single crystal from the melt, from extending back far into the single crystal, particularly into the cylindrical part, which is subsequently used, for example, for the production of wafers.

Since, because of the high temperatures in the region of the melt, the aforementioned camera is generally arranged outside the associated device for pulling the single crystal, and therefore usually sees the melt only at a relatively steep angle from above, the diameter of the single crystal can generally no longer be recorded in the region of the end cone.

It is, for example, possible to pull a very long end cone, at which angle the camera can just still record the bright ring. In this way, however, a very large amount of material is consumed which subsequently cannot be used and may possibly need to be melted again. The greater the diameter of the single crystal in the cylindrical region is, the greater the amount of material therefore is which is unnecessarily consumed in the end cone.

It is also possible to pull an end cone in which no regulation to the diameter takes place, i.e. the pulling of the end cone is carried out by control. Although a shorter end cone is thereby possible, the single crystal may separate prematurely from the melt if an angle becomes too small. Because of lack of regulation, corrective measures can then no longer be implemented in this case. This generally leads to slips or dislocations which run back into the crystal, so that this part of the single crystal cannot be utilized.

EP 0 758 690 A1, for example, discloses a method in which the diameter of the single crystal in the region of the end cone is recorded by means of a camera, a mirror being arranged in a region above the surface of the melt. Via the mirror, the camera can therefore see the bright ring even at relatively low angles. A disadvantage in this case, however, is that such a mirror is difficult to install and is furthermore very readily misted since vapors rise from the melt.

JP 63 021 280 A1 discloses a method in which the position of the camera during the pulling of the end cone is varied in order to be able to record a less steep angle. This, however, is disadvantageous since on the one hand extra outlay is incurred in the variation of the position of the camera, and on the other hand an exactly positioned camera is required for a reproducible single-crystal shape, which can no longer be ensured reliably with constant variation of the position of the camera.

EP 0 498 653 A2 discloses a method in which a lowering of the surface of the melt is determined from a weight of the single crystal pulled from the melt. From the lowering, for example, it is possible to determine a height by which the crucible must be adjusted, or an optical diameter determination of the single crystal may be corrected, for example by correcting the value of the height of the camera above the melt.

DE 42 31 162 A1 discloses a method for regulating a height of the surface of the melt in the crucible. To this end, a distance of the surface of the melt to a reference mark is determined.

U.S. Pat. No. 6,106,612 A, for example, discloses a method for determining a position of the surface of a melt in a crucible, from which a single crystal is pulled, relative to a fixed point.

It is therefore desirable to provide a simple solution for determining the diameter of the single crystal during the pulling of the single crystal from a melt.

SUMMARY OF THE INVENTION

The invention is directed to a method for determining a diameter ($d_K$) of a single crystal during the pulling of a cylindrical section of the single crystal and of an end cone of the single crystal from a melt) in a crucible of a device for pulling the single crystal, comprising
determining by measuring wherein the diameter ($d_K$) of the single crystal (200) at an interface with the melt, from
a first lowering rate ($v_S$) of a surface of the melt (relative to the crucible,
a first lifting rate ($v_K$), with which the single crystal is raised relative to the crucible (130), and
a conservation of mass, further comprising employing
a diameter of the single crystal determined during the pulling of a cylindrical section of the single crystal by means of observing a bright ring on the surface of the melt, as a correction, as a plausibility check or as a comparison of the diameter ($d_K$) of the single crystal, which is to be determined during the pulling of the single crystal.

BRIEF DESCRIPTION OF THE DRAWING FIXTURES

FIG. 1 schematically shows a device for pulling a single crystal from a melt, in which a method according to the invention may be carried out.

DETAILED DESCRIPTION OF THE PREFERRED EMBODIMENTS

Figure 1:
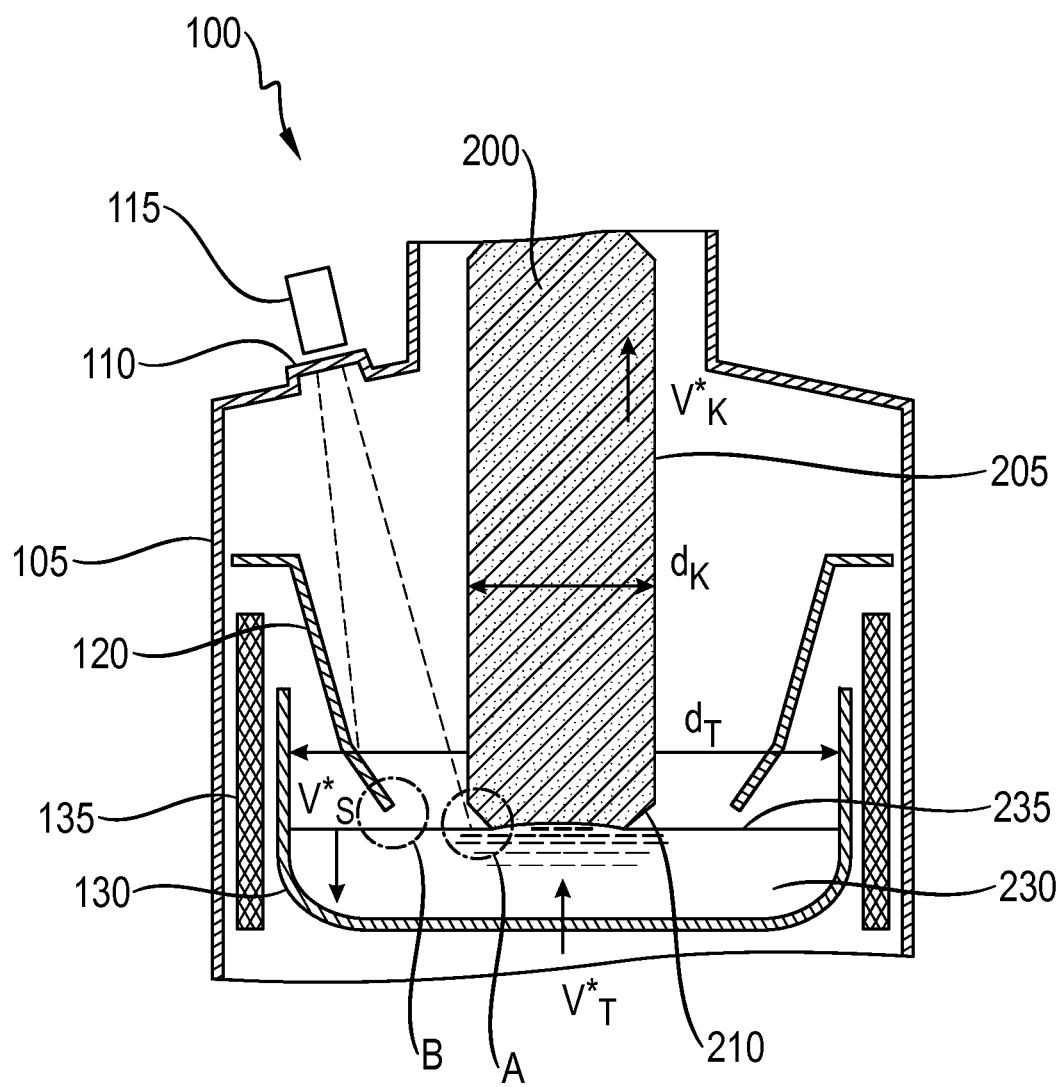

The method of the invention is used for determining a diameter of a single crystal during the pulling of the single crystal, in particular of an end cone of the single crystal, from a melt in a crucible of a device for pulling the single crystal. This method for pulling a single crystal is the so-called "Czochralski" method. According to the invention, the diameter of the single crystal at an interface with the melt is determined while taking into account a first lowering rate of a surface of the melt relative to the crucible, a first lifting rate with which the single crystal is raised relative to the crucible, and a conservation of mass.

The invention makes use of the fact that the mass of the material, in general a semiconductor material such as silicon, which crystallizes on the single crystal and therefore passes from the liquid state in the melt to the solid state on the single crystal, is conserved. From a lowering of the surface of the melt, it is possible to determine the mass of material which is taken from the melt and supplied to the single crystal. By means of the aforementioned equation of the conservation of mass, this mass corresponds to the mass of newly formed solid material on the single crystal. By means of the mass of the material which has been added to the single crystal, it is then in turn possible to deduce the diameter of the single crystal at the interface between the melt and the solid single crystal, i.e. in the region of the crystallization. For an associated formula, reference is made here to the description of the figures.

A particular advantage with this method is then that the lowering rate of the surface of the melt can be determined in a straightforward way in order to determine the diameter, while the diameter can no longer be determined in the conventional way by means of a camera especially in the case of a short end cone. Elaborate adjustment of the camera or fitting of a mirror is therefore no longer necessary. In this regard, it should also be noted that the lifting rate of the single crystal can also be determined very simply.

Preferably, a second lowering rate of the surface of the melt relative to the device, and a rate with which the position of the crucible relative to the device is varied, are determined in order to take into account the first lowering rate. The rate with which the position of the crucible is varied is generally a variable which can be adjusted directly in any case, and the second lowering rate can be determined very simply by a suitable method, as is described for example in U.S. Pat. No. 6,106,612 A. The difference between the latter two rates then gives the first lowering rate. The first lowering rate does not therefore need to be measured directly.

Advantageously, a rotation of the crucible, in particular its variation, is taken into account during the determination of the second lowering rate. Since, in the case of a rotation of the crucible, the surface of the melt in the crucible has at least to a first approximation a parabolic shape because of the centrifugal force, a more accurate value of the second lowering rate can be determined in this way. Expediently, the second lowering rate is determined at the same radial position on the surface of the melt at which the distance h mentioned below is ascertained.

It is advantageous when a second lifting rate, with which the single crystal is raised relative to the device, and a rate with which the position of the crucible relative to the device is varied, are determined in order to take into account the first lifting rate. As already mentioned, the rate with which the position of the crucible is varied is generally a variable which can be adjusted directly in any case. The second lifting rate is also a variable which can generally be adjusted directly. In this way, the first lifting rate does not need to be measured directly.

Advantageously, a density difference between liquid and solid material of the melt, or of the single crystal, is taken into account during the determination of the diameter of the single crystal. In this way, the diameter of the single crystal which was determined from the lowering rate of the surface of the melt can be calculated even more accurately. In this case, it should be noted that such a density difference, for example in the case of silicon, is about 10%.

It is advantageous when a shape of the crucible is taken into account during the determination of the diameter of the single crystal. The shape of the crucible may in this case have an influence on the mass of material corresponding to the reduction of the height of the melt in the crucible. In the upper region of the crucible, the crucible, or its wall, is generally cylindrical. Downward toward the bottom of the crucible, however, the diameter generally decreases. If for example a formula which describes the diameter of the crucible, or a corresponding table, for example a so-called look-up table, is then stored, then the current diameter of the crucible at the position of the surface of the melt can be determined very simply by means of a current position of the surface of the melt in the crucible, which may for example be determined from an initial position while taking into account the raising of the crucible and the lowering of the surface.

Preferably, a diameter of the crucible is taken into account during the determination of the diameter of the single crystal during the pulling of the end cone of the single crystal, which diameter of the crucible has been determined from the first or second lowering rate and the first or second lifting rate while taking into account the conservation of mass and a diameter of the single crystal as determined during the pulling of a cylindrical section of the single crystal. By means of the aforementioned relationship between the lowering rate and the lifting rate, it is possible to determine not only the diameter of the single crystal with a known diameter of the crucible, but conversely also the diameter of the crucible with a known diameter of the single crystal. In this way, a possible deviation of the actual diameter of the crucible from a setpoint value, which may for example occur because of manufacturing tolerances, can thus be determined very simply. Then, for example, the stored formula or look-up table relating to the shape of the crucible may therefore be corrected, so that more accurate determination of the diameter of the single crystal can be carried out particularly in the region of the end cone, when the precise shape of the crucible should be known as accurately as possible.

Expediently, a diameter of the single crystal, determined during the pulling of a cylindrical section of the single crystal by means of observing a bright ring on the surface of the melt, may additionally be used for a correction of, or plausibility check for a comparison with the diameter of the single crystal, which is to be determined according to the invention during the pulling, in particular, of the end cone of the single crystal. If the diameter of the single crystal at a position in the cylindrical part of the single crystal is determined in a conventional way, by taking into account the first lowering rate, the first lifting rate and the conservation of mass the diameter of the crucible at the position of the surface of the melt corresponding to this diameter of the single crystal may therefore be deduced and it is possible to establish whether this value deviates from the stored or calculated value of the diameter of the crucible. A deviation which may exist is taken into account during the pulling of the end cone, in order to increase the accuracy of the diameter of the single crystal as determined according to the invention. Expediently, the diameter of the crucible is corrected during the pulling of the end cone by a constant offset (relative or absolute), which is obtained from the deviation found.

Advantageously, a variation of a height and/or of a shape of a boundary region between the melt and the solid single crystal is taken into account during the determination of the diameter of the single crystal by means of a correction factor in a transition region between a cylindrical section of the single crystal and the end cone, and if necessary between an initial cone and the cylindrical section of the single crystal. This boundary region is the so-called meniscus, which is formed between the liquid melt and the solid single crystal. Both its height and its shape may vary in the event of a variation of the lifting rate and/or the temperature of the melt. Taking this into account is advantageous in particular when a variation of the lifting rate and/or of the temperature of the melt takes place, as is the case in the aforementioned transition region. In this transition region, the lifting rate is increased in a controlled way so that the height of the meniscus is raised by for example 2 mm, in order to achieve growth of the single crystal inward. This additional height of the meniscus causes lowering of the surface of the melt, but liquid material adheres to the single crystal above the position of the surface of the melt. In this context, for example, the density difference between liquid and solid material may be taken into account as a correction factor during the diameter determination. As an alternative, it is preferred that the determination of the diameter is interrupted in the transition region, when a predetermined variation of a height and/or of a shape of a boundary region between the melt and the solid single crystal occurs. In this way, possible errors in the diameter determination are avoided.

Preferably, noise suppression is carried out during the determination of the diameter of the single crystal, in particular after the differentiation of signals. Noise suppression is preferably carried out by means of a filter, for example a Kalman filter, an observer and/or an adaptive filter.

Expediently, the diameter of the single crystal as determined according to the invention is used as a variable to be regulated during the pulling of the single crystal, in particular of the end cone of the single crystal. As already mentioned above, regulation to a precise diameter is advantageous particularly in the region of the end cone, since an end cone with a small angle is therefore possible. In this way, material can be saved and premature separation of the single crystal from the melt can be prevented.

Preferably, the first lifting rate and/or the second lifting rate of the single crystal, a rate with which the position of the crucible is varied, one or more powers and/or temperatures of the device, and/or a rotation rate of the single crystal and/or of the crucible are used as manipulated variables during the pulling of the single crystal. These variables are the variables that are generally to be adjusted during the pulling of the single crystal. The power or the temperature may, in particular, be that of a heater which is provided for heating the melt. As already mentioned, the temperature of the melt plays a role in the growth of the single crystal. In this way, maximally accurate regulation of the diameter in the end cone can therefore be carried out.

The invention makes it possible to produce shorter regulated end cones, particularly in the case of single-crystal ingots with a diameter of 300 mm or more. Furthermore, the reproducibility is increased compared with processes that are only controlled. No additional parts such as mirrors are necessary, and an existing camera does not need to be moved or have its parameters modified. Defined shorter end cones increase the quality of the single-crystal ingot produced because of slips being avoided and reduce the scrap.

Other advantages and configurations of the invention may be found in the description and the appended drawing.

It is to be understood that the features mentioned above and those yet to be explained below may be used not only in the combination respectively indicated, but also in other combinations or individually, without departing from the scope of the present invention.

The invention is schematically represented with the aid of an exemplary embodiment in the drawing, and will be described below with reference to the drawing.

FIG. 1 schematically represents a device for pulling a single crystal from a melt, during which a method according to the invention may be carried out. The device 100 comprises a housing 105, in which a crucible 130 is arranged. At least one heating device 135, by means of which the crucible 130 can be heated, is provided between the housing 105 and the crucible 130.

A melt 230 of a material intended for the single crystal is introduced into the crucible 130. This material may, for example, be silicon. In particular, polycrystalline silicon may in this case be introduced into the crucible 130, this polycrystalline silicon being melted in the crucible 130 and the single crystal 200 subsequently being formed therefrom.

The diameter of the crucible 130 is denoted by $d_T$. In this case, it can be seen that the crucible 130 has a progressively smaller diameter in the lower region, i.e. close to the bottom. The shape of the crucible as shown here is only exemplary, and it is to be understood that the crucible may also have other shapes. As a general rule, however, a crucible that has a decreasing diameter will be used.

In order to pull the single crystal 200, a small single crystal, a so-called seed, is introduced into the melt 230 and is subsequently raised by means of a pulling device (which is not shown here). The phase of the pulling of the single crystal as shown here shows a phase toward the end of the pulling, during which a so-called end cone is pulled, i.e. the diameter $d_K$ of the single crystal 200 becomes smaller.

Both the crucible 130 and the single crystal 200 may, for example, also be rotated. The rotation directions are in this case generally opposite. This rotation is, for example, intended so that an essentially cylindrical shape of the single crystal is obtained.

Furthermore, a heat shield 120 is provided so that the heat emitted by the heating device 135 is kept away from the upper region of the single crystal 200.

Furthermore, provided in the housing 105 there is a window 110, in front of which optical acquisition means 115 configured as a camera are fitted. The camera 115 in this case has an acquisition range which is directed between the single crystal 200 and the heat shield 120 onto the surface 235 of the melt 230, as is indicated by means of dashed lines. Here, it can already be seen clearly that the acquisition range of the camera does not include the boundary region between the single crystal 200 and the surface 235, as can be seen in the excerpt A. A bright ring formed in this boundary region which can otherwise be recorded by the camera, i.e. for example during the pulling of a cylindrical section 205 of the single crystal, cannot be used here in order to determine the diameter of the single crystal.

Furthermore represented schematically are a second lifting rate $v^*_K$ of the single crystal 200, with which the single crystal is raised relative to the device 100, a second lowering rate $v^*_S$ of the surface 235 of the melt 230 relative to the device 100, and a crucible lifting rate $v^*_T$, with which the crucible 230 is raised relative to the device 100.

Figure 2:
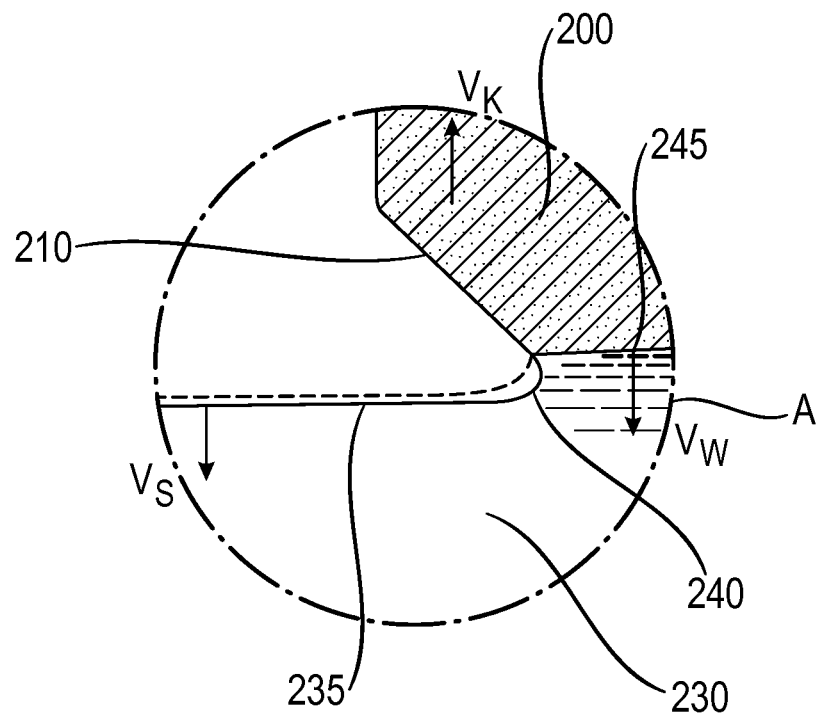
FIG. 2 shows an excerpt of FIG. 1, in which a boundary region between the single crystal and the melt is represented in more detail.

The excerpt A indicated in FIG. 1 is represented in more detail in FIG. 2. In particular, shown here is the boundary region 240 between the melt 230 and the single crystal 200, which is also referred to as a so-called meniscus. The solid single crystal ends at the interface 245, below which there is liquid material. At the interface 245, the liquid material crystallizes with a rate $v_W$.

Furthermore represented are a first lifting rate $v_K$ of the single crystal 200, with which the single crystal is raised relative to the crucible 130, and a first lowering rate $v_S$ of the surface 235 of the melt 230 relative to the crucible 130. The rate $v_W$ is in this case obtained from the first lifting rate $v_K$ and the first lowering rate $v_S$ as $v_W = v_K + v_S$, taking into account the signs of the rates as shown in the figure.

The rates shown in FIG. 2 may then be converted into the rates shown in FIG. 1. Here, $v_K = v^*_K - v^*_T$ and $v_S = v^*_S - v^*_T$ apply. It should be noted in this case that the rates shown in FIG. 2 are relative to the crucible, for which reason the crucible lifting rate $v^*_T$ must be taken into account for the conversion.

The shape of the meniscus 240, shown here by means of a solid line, corresponds to such a shape as should generally exist during the pulling of the end cone. It can be seen that the surface of the meniscus 240 extends inward (toward the right in the figure) starting from the single crystal 200. Since the single crystal grows at the interface 245 in the direction of a tangent to the surface of the meniscus, an end cone with a decreasing diameter can therefore be produced.

In addition, by means of a dashed line next to the meniscus 240, yet another shape of a meniscus is shown, as is used for example during the pulling of an initial cone, i.e. with an increasing diameter. In particular, it can also be seen in this case that the height of the meniscus, i.e. the vertical distance between the interface 245 at the outer diameter of the single crystal and the surface 235, depends on the shape of the meniscus.

Figure 3:
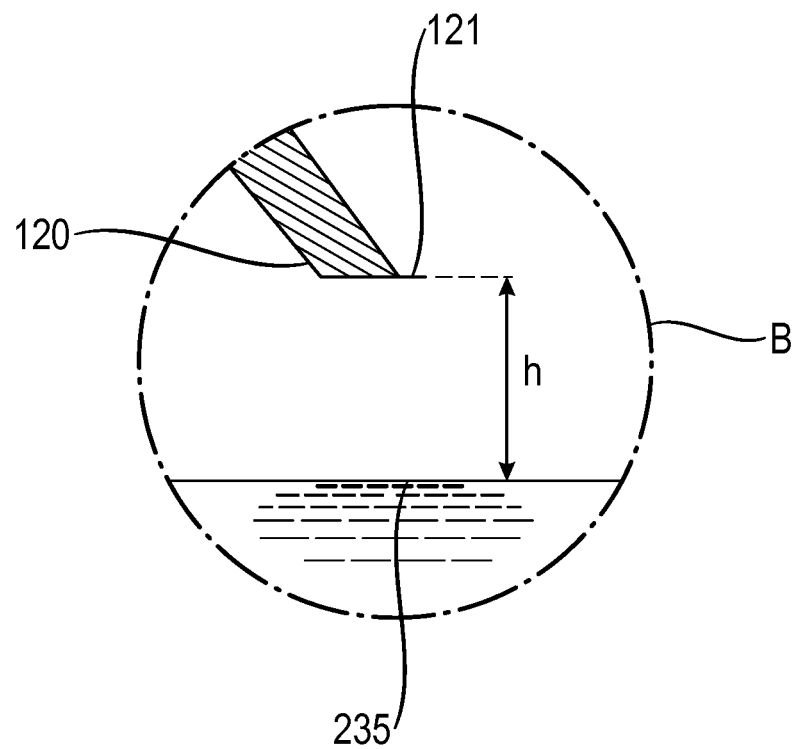
FIG. 3 shows an excerpt of FIG. 1, in which a part of a heat shield above the surface of the melt is represented in more detail.

The excerpt B indicated in FIG. 1 is represented in more detail in FIG. 3. In particular, a part of the heat shield 120 above the surface 235 of the melt is represented in more detail here.

A component 121 is fitted on the lower edge of the heat shield 120 facing toward the single crystal and shown here on the right. This component 121, for example in the form of a recess or a tongue, is therefore fixed in the device 100. Furthermore, a distance h between the component 121 and the surface 235 is shown.

In this regard, it should be pointed out that the distance defined in the manner shown here between the surface 235 and a component fixed in the device 100 is only exemplary. A different fixed component may also be used for this purpose, so long as this component lies in the acquisition range of the camera.

Figure 4:
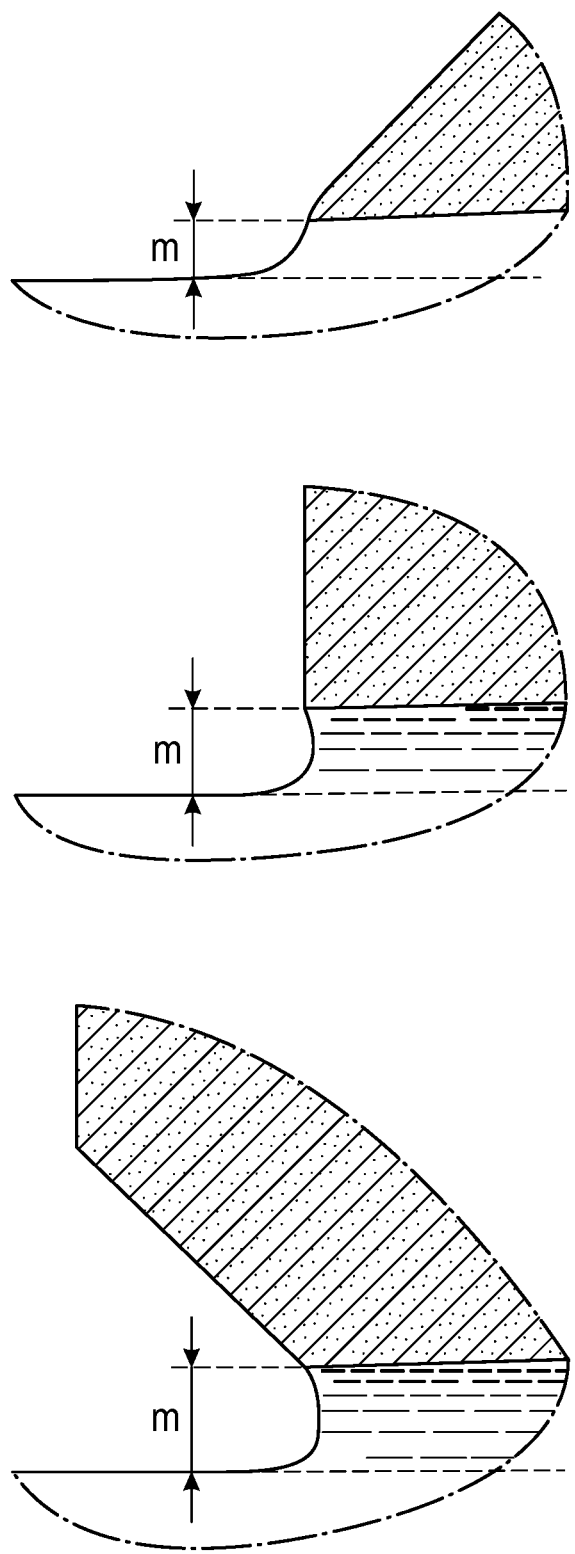
FIG. 4 shows a meniscus height during various phases of the pulling of a single crystal.

FIG. 4 shows a meniscus height m during various phases of the pulling of the single crystal. Pulling of an initial cone can be seen in the upper representation, during which a small meniscus height m of for example 3 mm is selected in order to achieve a decrease in the diameter.

Pulling of a cylindrical section of the single crystal is shown in the central representation, during which a medium meniscus height of for example 7 mm is selected in order to keep the diameter constant. Pulling of an end cone is shown in the lower representation, during which a large meniscus height of for example 9 mm is selected in order to reduce the diameter. In this case, it can thus be seen that the meniscus height m is increased significantly at the transition from the cylindrical section into the end cone.

By a derivative of the distance h with respect to time, it is then possible to determine the second lowering rate $v^*_S$, with which the position of the surface 235 is moved relative to the device 100. For the determination of the distance h, reference is made here for example to U.S. Pat. No. 6,106,612 A. By furthermore taking into account the first lifting rate $v^*_T$ of the crucible, which is generally adjusted and therefore known, the first lowering rate $v_S$ of the surface 235 of the melt relative to the crucible 130 can therefore be determined.

The second lifting rate w of the single crystal may be determined from the second lifting rate $v^*_K$, with which the single crystal is raised relative to the device 100, while taking into account the crucible rate $v^*_T$.

It is to be understood that various operations, such as filtering, may also be used during the determination of these rates, in particular of the first lowering rate $v^*_S$ from the derivative of the distance h with respect to time, in order to obtain better values with lower noise. Particularly suitable for this are, for example, a Kalman filter, an observer and/or an adaptive filter. Compared with conventional simple methods, such filters in the scope of numerical methods can achieve results with lower noise.

$$d_K^2 \cdot \rho_s \cdot (v_K + v_S) = d_T^2 \cdot \rho_f \cdot v_S \quad \text{The formula}$$

with $\rho_s$ and $\rho_f$ the densities respectively of the solid and liquid material of the single crystal, or of the melt, then gives the conservation of mass in the reference system of the crucible. This means that the mass of material which is formed per unit time as a solid component of the single crystal corresponds to the mass of liquid material consumed for this from the melt. The rate $v_W$, which is presented here as $v_K + v_S$, indicates the mass increase of the single crystal. From this equation, the diameter $d_K$ of the single crystal may then be given as $$d_K = d_T \cdot \sqrt{\frac{\rho_f}{\rho_s} \cdot \frac{V_S}{V_K + V_S}}.$$

The two values for the density of the solid or liquid material are generally known, and are, for example, for silicon $\rho_s$=2329 kg/m³ and $\rho_f$=2580 kg/m³. The two values of the rates may be determined as explained above. If the rates in the reference system of the crucible are replaced with the measured rates, then the diameter $d_K$ of the single crystal may be given as $$d_K = d_T \cdot \sqrt{\frac{\rho_f}{\rho_s} \cdot \frac{(V_S^* + V_T^*)}{(V_K^* + V_S^*)}}.$$

The diameter $d_T$ of the crucible at the height of the surface may, for example, be determined with the aid of the aforementioned shape of the crucible mathematically or from a look-up table, while taking into account the position of the surface relative to the crucible or its wall.

As an alternative, however, the shape of the crucible may also be given by means of a formula, for example a closed-form analytical formula or a fit of higher-order polynomials, and in particular in sections. In all variants, the corresponding diameter of the crucible can in this case be obtained straightaway, for example by specifying the position of the surface of the melt relative to the crucible. The position of the surface of the melt relative to the crucible may, for example, be determined by taking into account the lowering rates and the crucible lifting rate.

In the manner presented here, it is thus then possible to determine the diameter $d_K$ of the single crystal, particularly in the region of the end cone. This therefore allows regulation to the diameter in a manner known per se. For example, the second lifting rate $v^*_K$ of the single crystal, the rate $v^*_T$ with which the height of the crucible is varied, one or more powers and/or temperatures of the device 100, and/or a rotation rate of the single crystal and/or of the crucible, may be used as manipulated variables for the regulation.

Furthermore, a correction factor may be taken into account during the determination of the diameter $d_K$ of the single crystal in the transition region between the cylindrical section and the end cone, a so-called bend. The reason for this resides in the sudden raising of the meniscus height, as can be seen in FIG. 4. If the difference in the meniscus height before and after the bend is known, a correction factor may be determined by taking into account the different densities of solid and liquid material. The correction factor may then be used until the process of pulling the single crystal has stabilized again. As an alternative, however, the diameter determination may also be interrupted in this transition region so that an erroneous diameter is not determined.

The invention claimed is:

1. A method for determining a diameter (dK) of a single crystal during the pulling of a cylindrical section of the single crystal and of an end cone of the single crystal from a melt in a crucible of a device for pulling the single crystal, comprising
determining the diameter (dK) of the single crystal at an interface with the melt, from
a first lowering rate ($v_S$) of a surface of the melt relative to the crucible,
a first lifting rate (vK), with which the single crystal is raised relative to the crucible, and
a conservation of mass,
additionally determining a $d_K'$ diameter of the single crystal during the pulling of the cylindrical section of the single crystal by means of observing a bright ring on the surface of the melt,
employing the additionally determined dK diameter of the single crystal as a correction, a plausibility check, or a comparison of the determined diameter ($d_K$) of the single crystal, and wherein
either a variation of a height and/or of a shape of a boundary region between the melt and the solid single crystal is taken into account during the determination of the diameter (dK) of the single crystal by means of a correction factor in a transition region between a cylindrical section of the single crystal and the end cone,
or the determination of the diameter of the single crystal is interrupted in a transition region between a cylindrical section of the single crystal and the end cone, when a predetermined variation of a height and/or of a shape of a boundary region between the melt and the solid single crystal occurs.

2. The method of claim 1, further comprising determining a second lowering rate (v*S) of the surface of the melt relative to the device, and a rate (v*T) with which the position of the crucible relative to the device is varied, in order to take into account the first lowering rate ($v_S$) of the surface of the melt relative to the crucible.

3. The method of claim 1, wherein a rotation of the crucible and a variation of the rotation are taken into account during the determination of the second lowering rate (v*S).

4. The method of claim 1, wherein a second lifting rate (v*K), with which the single crystal is raised relative to the device, and a rate (v*T) with which the position of the crucible relative to the device is varied, are determined in order to take into account the first lifting rate (vK) with which the single crystal is raised relative to the crucible.

5. The method of claim 1, wherein a density difference between the density of the liquid material of the melt and the density of the single crystal is taken into account during the determination of the diameter (dK) of the single crystal.

6. The method of claim 1, wherein the diameter of the crucible at the position of the surface of the melt is taken into account during the determination of the diameter (dK) of the single crystal.

7. The method of claim 1, wherein a diameter (dT) of the crucible is taken into account during the determination of the diameter ($d_K$) of the single crystal during the pulling of the end cone of the single crystal (200), and the accuracy of the determination of the diameter (dK) of the single crystal is increased by correcting the diameter (dT) of the crucible by a constant offset.

8. The method of claim 1, wherein noise suppression by means of a filter, an observer and/or an adaptive filter, is carried out during determination of the diameter (dK) of the single crystal.

9. The method of claim 1, wherein the diameter (dK) of the single crystal which is determined is used as a variable to be regulated during the pulling of the constant diameter portion of single crystal.

10. The method of claim 1, wherein the diameter (dK) of the single crystal which is determined is used as a variable to be regulated during the pulling of the end cone of single crystal.

11. The method of claim 9, wherein the first lifting rate (vK) and/or the second lifting rate (v*K) of the single crystal, a rate (vT) with which the position of the crucible is varied, the power of one or more heaters for heating the melt and/or temperatures of the device, and/or a rotation rate of the single crystal and/or of the crucible are used as manipulated variables during the pulling of the single crystal.

12. The method of claim 10, wherein the first lifting rate (vK) and/or the second lifting rate (v*K) of the single crystal, a rate (vT) with which the position of the crucible is varied, the power of one or more heaters for heating the melt and/or temperatures of the device, and/or a rotation rate of the single crystal and/or of the crucible are used as manipulated variables during the pulling of the single crystal.

* * * * *